(12) United States Patent
Knecht

(10) Patent No.: US 6,700,448 B1
(45) Date of Patent: Mar. 2, 2004

(54) HIGH PERFORMANCE DUAL RANGE OSCILLATOR MODULE

(75) Inventor: Thomas Knecht, Dundee, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/231,992

(22) Filed: Aug. 30, 2002

(51) Int. Cl.$^7$ ................................................ H03B 1/00
(52) U.S. Cl. ........................................ 331/68; 331/158
(58) Field of Search ......................... 331/68, 69, 158; 310/348

(56) References Cited

U.S. PATENT DOCUMENTS

| | | | |
|---|---|---|---|
| 4,180,783 A | 12/1979 | Khalifa | |
| 4,987,373 A | 1/1991 | Soo | |
| 5,349,310 A | 9/1994 | Rieder et al. | |
| 5,405,476 A | 4/1995 | Knecht | |
| 5,432,827 A | 7/1995 | Mäder | |
| 5,446,954 A | 9/1995 | Knecht et al. | |
| 5,473,274 A | 12/1995 | Reilly et al. | |
| 5,500,628 A | * 3/1996 | Knecht | 331/68 |
| 5,504,460 A | * 4/1996 | Ikeda et al. | 331/158 |
| 5,512,860 A | 4/1996 | Huscroft et al. | |
| 5,563,531 A | 10/1996 | Meyer | |
| 5,877,657 A | 3/1999 | Yoshinaka | |
| 5,929,712 A | 7/1999 | Kuriyama | |
| 5,952,890 A | 9/1999 | Fallisgaard et al. | |
| 5,987,085 A | 11/1999 | Anderson | |
| 6,066,989 A | 5/2000 | Knecht et al. | |
| 6,081,163 A | 6/2000 | Ujiie et al. | |
| 6,081,164 A | 6/2000 | Shigemori et al. | |
| 6,133,795 A | 10/2000 | Williams | |
| 6,154,095 A | 11/2000 | Shigemori et al. | |
| 6,172,576 B1 | 1/2001 | Endo et al. | |
| 6,181,217 B1 | 1/2001 | White | |
| 6,229,249 B1 | 5/2001 | Hatanaka et al. | |
| 6,229,404 B1 | 5/2001 | Hatanaka | |
| 6,239,669 B1 | 5/2001 | Koriyama et al. | |
| 6,304,151 B1 | 10/2001 | Uehara et al. | |

FOREIGN PATENT DOCUMENTS

| | | |
|---|---|---|
| EP | 0 724 334 A1 | 7/1996 |
| JP | 54-118993 | 9/1979 |
| JP | 57-200370 | 11/1982 |

* cited by examiner

Primary Examiner—Kenneth B. Wells
(74) Attorney, Agent, or Firm—Steven Weseman; Mark Borgman; Mark P. Bourgeois

(57) ABSTRACT

A dual-range crystal oscillator module comprises lower and upper wiring board panels each having a component side, a surface mount side, a central portion and an outer edge portion including a plurality of input-output contacts. A lower set of crystal oscillator components is mounted to the lower wiring board panel such that the lower set and the lower wiring board panel define a first crystal oscillator circuit. An upper set of crystal oscillator components is mounted to upper wiring board panel such that the upper set of crystal oscillator components and the upper wiring board panel together define a second crystal oscillator circuit. A side-wall frame is attached between the upper and the lower wiring boards providing connections between the input-output contacts of the upper wiring board panel and the input-output contacts of the lower wiring panel.

24 Claims, 6 Drawing Sheets

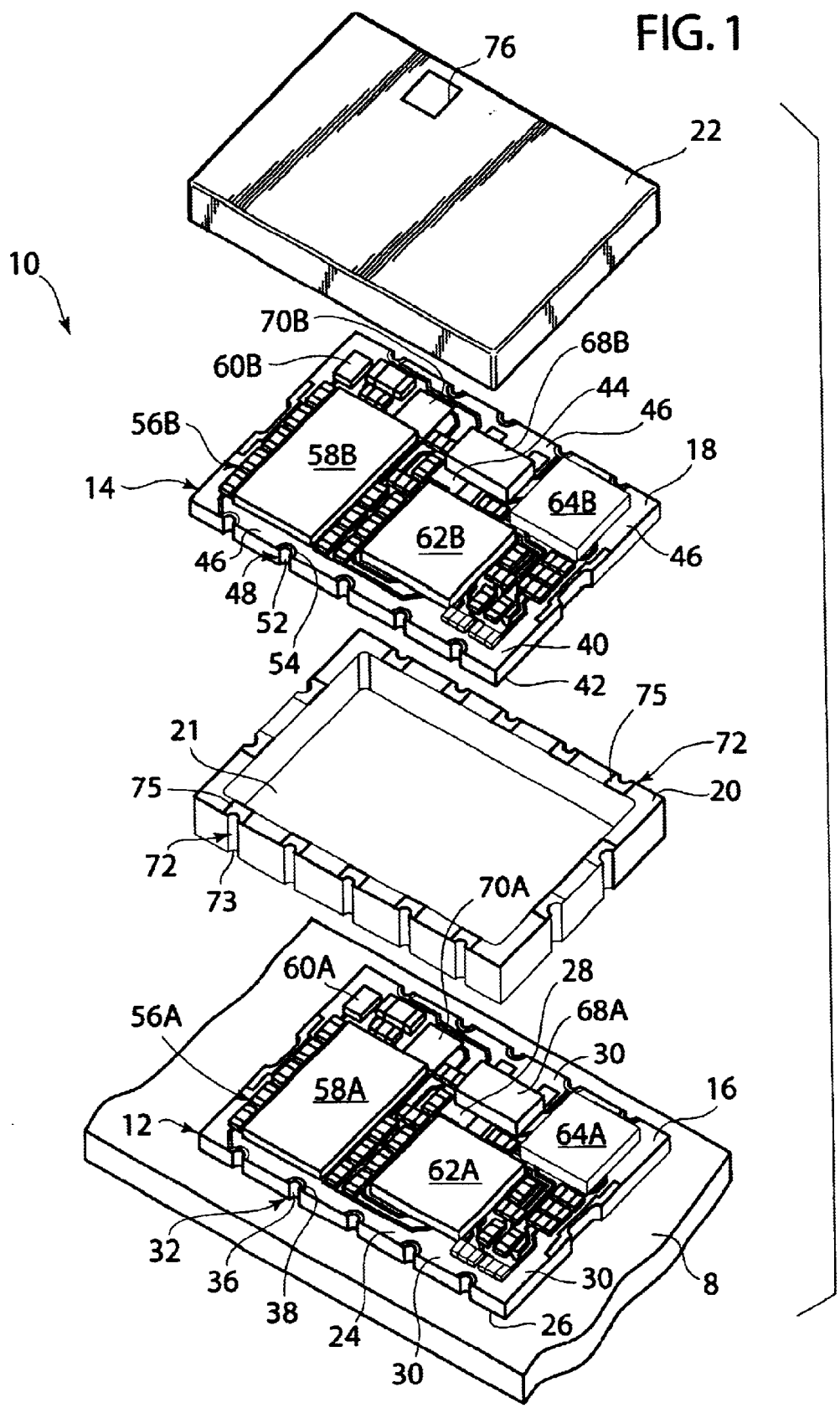

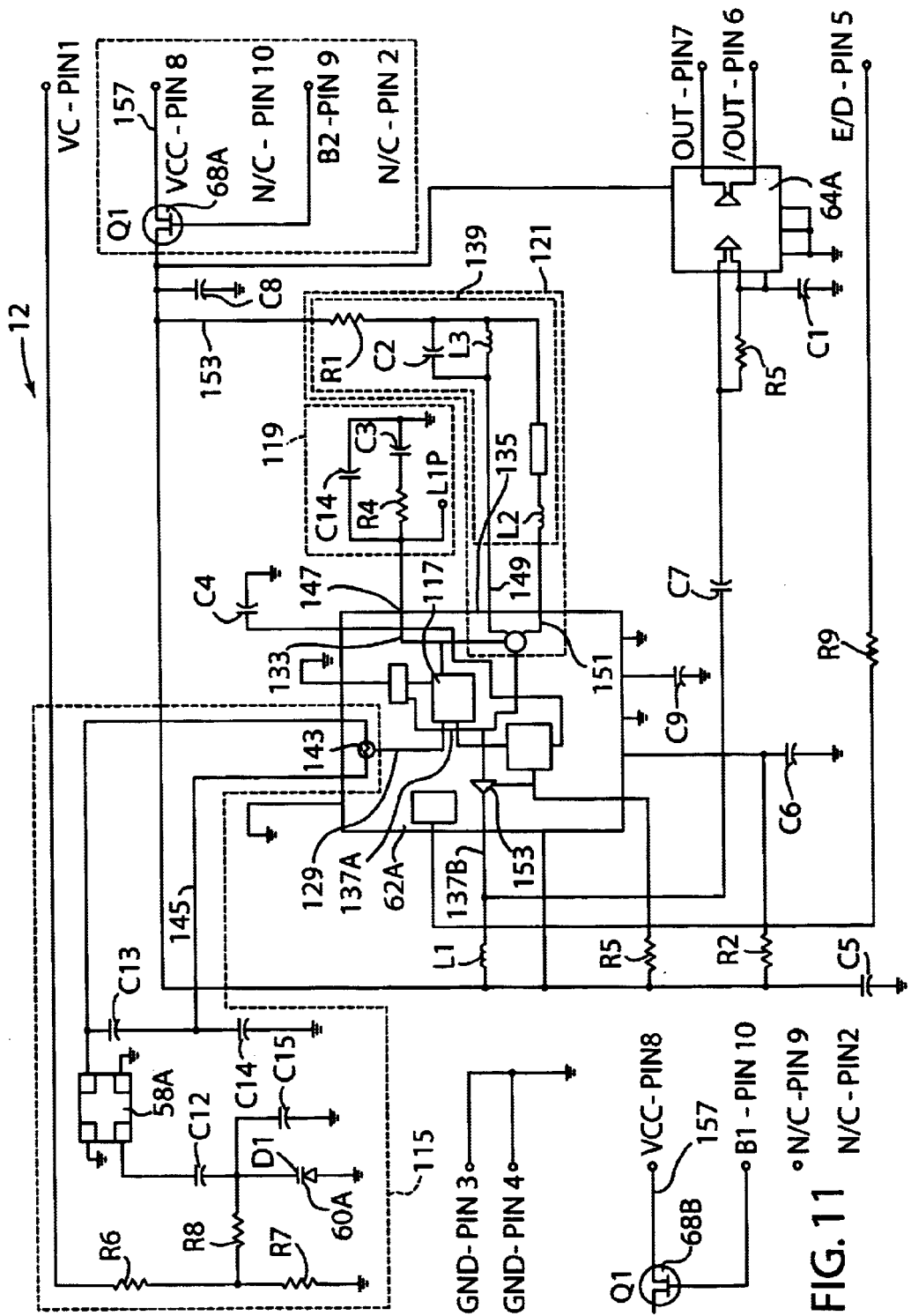

HIGH PERFORMANCE DUAL RANGE OSCILLATOR MODULE

TECHNICAL FIELD

This invention relates to voltage controlled crystal oscillators, and in particular, to cost-effective packaged modules providing at least two different and relatively high-frequency oscillator outputs.

BACKGROUND

High capacity data networks rely on signal repeaters and sensitive receivers for low-error data transmission. To decode and/or cleanly retransmit a serial data signal, such network devices include components for creating a data timing signal having the same phase and frequency as the data signal. This step of creating a timing signal has been labeled "clock recovery."

Data clock recovery requires a relatively high purity reference signal to serve as a starting point for matching the serial data signal clock rate and also requires circuitry for frequency adjustment. The type, cost and quality of the technology employed to generate the high purity reference signal varies according to the class of data network application. For fixed large-scale installations, an "atomic" clock may serve as the ultimate source of the reference signal. For remote or movable systems, components including specially configured quartz resonators have been used. As communication network technology progresses towards providing higher bandwidth interconnections to local area networks and computer workstations, the need has grown for smaller and less-expensive clock recovery technology solutions.

For many clock recovery applications, the reference signal generator must be adjustable, i.e., controllable, over a precisely defined operating curve. This adjustability requirement is conveniently defined as an Absolute Pull Range (APR). APR is defined as the controllable frequency deviation (specified in ±ppm) from the nominal frequency ($F_0$) over a wide range of operating parameters, including supply voltage variations, temperature variations, output load variations, and time (i.e., aging). Clock recovery may require controllable oscillators having both a minimum and a maximum APR.

A typical optoelectronics system includes numerous line cards and a backplane. Frequently the end use of a particular system is not determined until a specific customer request is known. For example, a line card could be for a SONET application (622.08 MHz) or for a Gigabit ETHERNET application (644.531 MHz). Therefore, optoelectronic line cards that are compatible with more than one communication standard offer manufacturers both an overall cost-of-production and a marketing advantage. If the desired final frequency could be implemented with just a software command after the system has been constructed, the flexibility of the system would be greatly enhanced.

Recent revisions made to optical communication standards endorse forward error correction (FEC) techniques. To implement FEC techniques, optoelectronic systems must be able to operate at a standard communication frequency (e.g., SONET 622.08 MHz) and also one of the common forward error correction (FEC) frequencies, 666.514 MHz or 669.326 MHz. A dual range VCXO or a dual range reference clock or one of each type would be advantageous for this reason.

Accordingly, network device manufacturers, especially those working with optical systems, desire multiple high-performance oscillators in the same assembly at reduced sizes and low cost.

SUMMARY

The present invention offers a solution to the two-frequencies requirement by providing a dual-range oscillator module in a cost-effective, reduced footprint package. The dual-range oscillator modules comprise an upper and a lower wiring board panel, an upper set of crystal oscillator components mounted to a component side of the upper wiring board panel, a lower set of crystal oscillator components mounted to a component side of the lower wiring board panel, and a side-wall frame including a plurality of conductors for providing connections between input-output contacts of the upper wiring board panel and the input-output contacts of the lower wiring panel.

Each wiring board panel has a component side, a surface mount side, a central portion and an outer edge portion that includes a plurality of input-output contacts. The lower set of crystal oscillator components is mounted to the component side of the lower wiring board panel such that the lower set of components and the lower wiring board panel together define a first crystal oscillator circuit. The upper set of crystal oscillator components is mounted to the component side of the upper wiring board panel such that the upper set of components and the upper wiring board panel together define a second crystal oscillator circuit.

The side-wall frame is set between the upper and the lower wiring board. The side-wall frame includes a plurality of conductors linking the input-output contacts of the upper wiring board panel and the input-output contacts of the lower wiring panel.

There are other advantages and features of this invention which will be more readily apparent from the following detailed description of the preferred embodiment of the invention, the drawings, and the appended claims.

BRIEF DESCRIPTION OF THE FIGURES

In the accompanying drawings that form part of the specification, and in which like numerals are employed to designate like parts throughout the same, FIG. 1 is an exploded perspective view of a dual-range oscillator module according to an embodiment this invention;

FIG. 10 is a simplified circuit diagram of an exemplary controllable crystal oscillator circuit present on each of the lower and the upper wiring board panels; and FIG. 11 is a fragmentary circuit diagram illustrating how the oscillator circuit of the upper panel differs from the oscillator circuit of the lower panel.

DETAILED DESCRIPTION OF PREFERRED EMBODIMENTS

Figure 6:
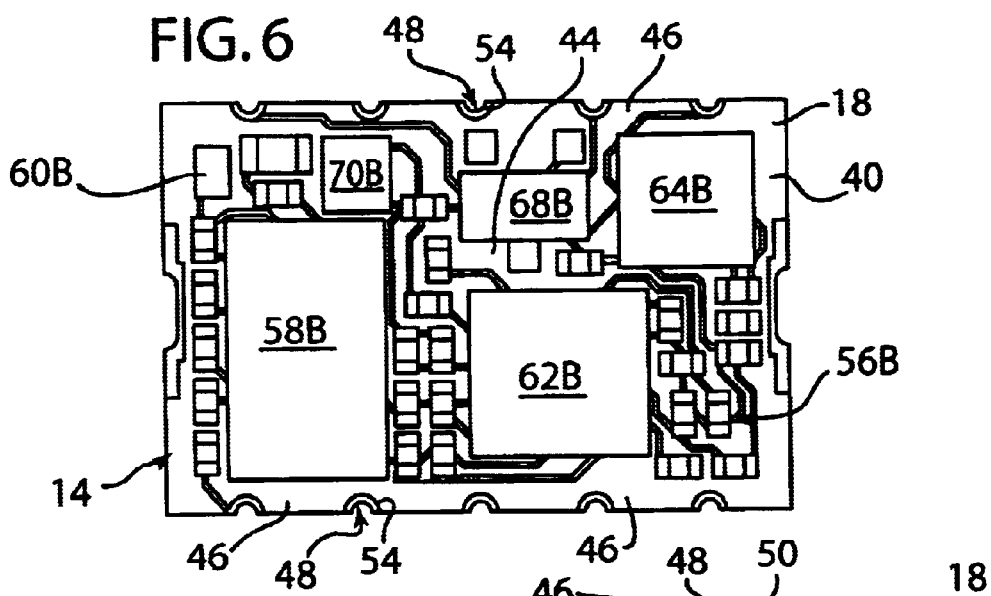
FIG. 6. is a plan view of the upper wiring panel populated with crystal oscillator circuit components.

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

In the FIGURES, a single block or cell may indicate several individual components and/or circuits that collectively perform a single function. Likewise, a single line may represent several individual signals or signal transmission paths for performing a particular operation.

FIG. 1 is an exploded view of a dual-range voltage controlled crystal oscillator (VCXO) module 10 including two substantially independent and separate VCXO circuits 12 and 14. Module 10 includes a lower wiring board panel 16, an upper wiring board panel 18, a side wall frame 20 and a cover 22.

Lower wiring board panel 16 has a componentside 24 and a surface mount side 26, a central portion 28, an outer edge portion 30 and a plurality of input-output contacts 32. Each input-output contact 32 is formed of a conductive layer that extends from surface mount pads (or contact portions) 34 on bottom side 26 (FIG. 5), to side castellations 36, and pads (or contact portions) 38 on top, component side 24 of lower panel 16. More specifically, the plurality of input-output contacts 32 of lower panel 16 includes a plurality of pads (or contacts) 38 on component side 24 aligned and interconnected with a plurality of mounting pads (or contacts) 34 on surface mount side 26.

Figure 7:
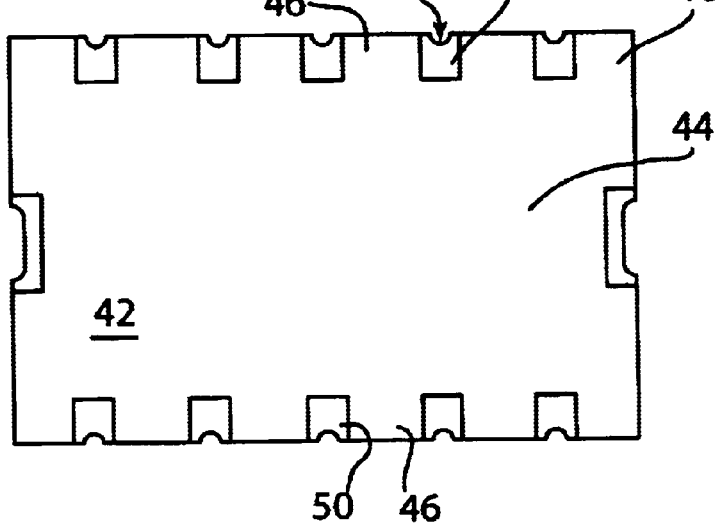
FIG. 7 is a plan view of the bottom side of the upper wiring board panel.

Likewise, upper wiring board panel 18 has a component side 40 and a bottom, attachment side 42, a central portion 44, an outer edge portion 46 and a plurality of input-output contacts 48. Each upper panel input-output contact 48 is formed of a conductive layer that extends from pads (or contact portions) 50 on bottom side 42 (FIG. 7), to side castellations 52, and pads (or contact portions) 54 on top, component side 44.

Mounted to component side 24 of lower panel 16 is a set of crystal oscillator components 56A including a packaged surface-mounted crystal resonator 58A, a crystal warping varactor 60A, a multi function IC with phase locked loop 62A, an analog to digital translator IC 64A, a circuit selector switch IC 68A, and a laser adjustable inductor pad 70A. Lower set of components 56A and the wiring pattern of lower wiring board panel together defire a first crystal oscillator circuit 12.

It is a significant feature of the present invention that upper wiring board panel 18 and lower wiring board panel 16 may define substantially similar and independent oscillator circuits. Accordingly, component side 40 of upper panel 18 supports a set of upper crystal oscillator components 56B including a packaged surface mounted crystal resonator 58B, a crystal warping varactor 60B, a multi-function IC with phase-locked loop 62B, an analog-to-digital translator IC 64B, a circuit selector switch IC 68B, and a laser adjustable inductor pad 70B. Upper set of components 56B and the wiring pattern of upper wiring board panel 18 together define a second crystal oscillator circuit 14.

Side-wall frame 20 is positioned between upper 18 and lower 16 wiring board panels to provide spacing and electrical communication therebetween. Extending across sidewall frame 20 are a plurality of conductors 72 for providing connections between input-output contacts 48 of upper panel 18 and input-output contacts 32 of lower wiring panel 16.

Side-wall frame 20 is preferably constructed from printed wiring board material. Printed wiring boards include a non-conductive substrate and copper traces. The non-conductive substrate is preferably a composite material, for example, epoxy-glass, phenolic-paper, or polyester-glass; and typical composites used in circuit board manufacturing include polyimides for flexible circuitry or high-temperature applications; paper/phenolic which can be readily punched: National Electrical Manufacturers Association (NEMA) grade FR-2; paper/epoxy which has better mechanical properties than the paper/phenolic: NEMA grade FR-3; glass/epoxy and woven glass fabric which have good mechanical properties: NEMA grade FR-4, FR-5; and random glass/polyester which is suitable for some applications: NEMA grade FR-6. NEMA FR-4 material is preferred.

Frame 20 is cost effectively prepared by first providing a larger printed circuit board having an array of panels delineated by conductive vias marking the outer perimeter of the desired frames. The PCB array has a desired, predetermined thickness. Open central portion 21 is created by routing the inside of each panel to the desired inner perimeter of each frame 20. Next, the frames are singulated by dicing (with a saw or laser) through the conductive vias. The step of dicing through the vias creates the conductive side castellations 73 which serve as a connection between the input/outputs of upper panel 18 and the input/outputs of lower panel 16 in the assembled oscillator module.

Figure 2:
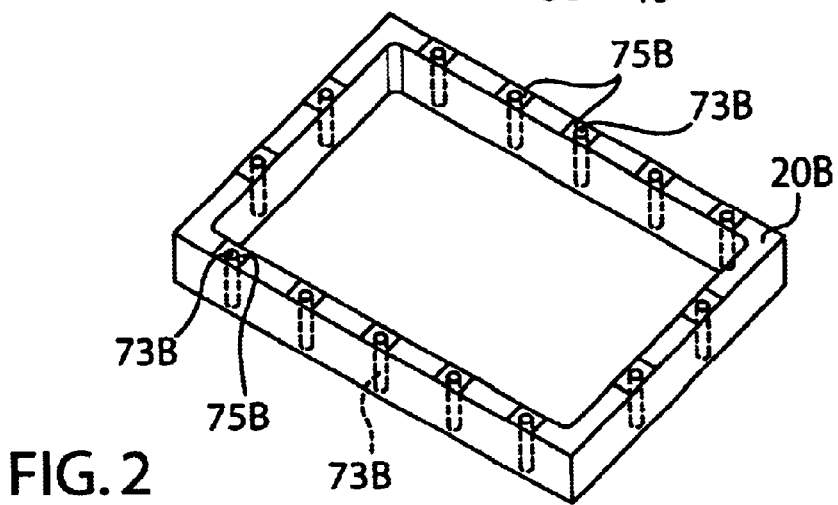
FIG. 2 is a perspective view of an alternate side-wall frame embodying the present invention.

The side-wall frame may have alternate configurations as shown in FIG. 2. Sidewall frame 20B provides connections between upper panel 18 and lower panel 16 in the form of complete, undivided conductive vias 73B. Conductive vias 73B extend between pads 75B present on both the upper side and the bottom side of frame 20B.

Figure 8:
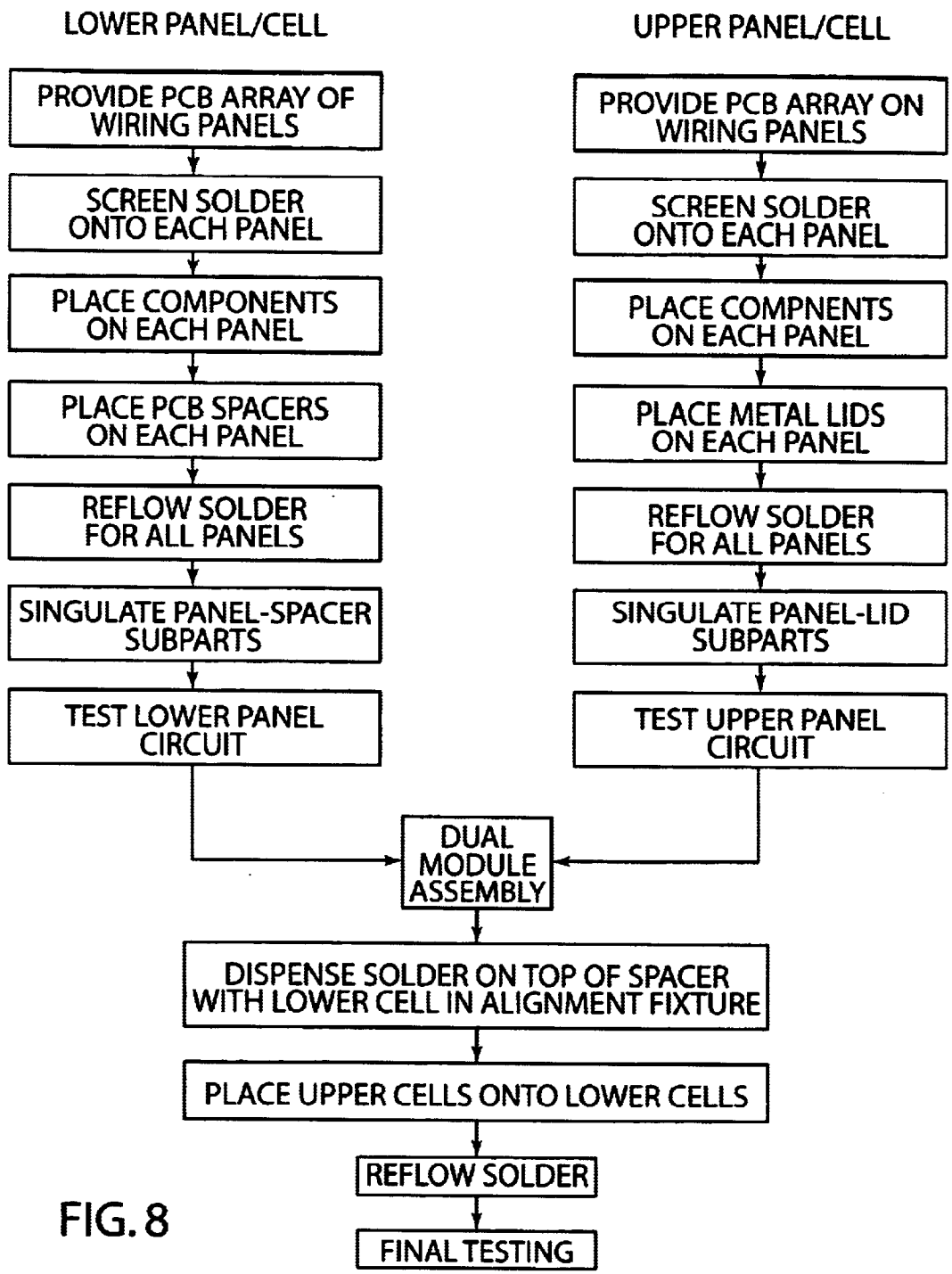
FIG. 8 is a process flowchart for the steps of making a dual-range oscillator module according to an embodiment of the present invention.

Flowchart FIG. 8 describes exemplary steps for making a dual-range oscillator module according to the present invention. Dual-range oscillator module 10 is preferably fabricated by preparing a plurality of sidewall frames 20, preparing a plurality of lower wiring panels 16 populated with oscillator components 56A and attached side-wall frames 20, and preparing a plurality of upper wiring panels 18 populated with oscillator components 56B and attached metal lids 22. Thereafter, the upper panel with lid subassemblies (18-56B-22) are attached to the lower panel-with frame subassemblies (16-56A-20).

As described above, aplurality of side wallframes 20 are prepared by first providing a larger printed circuit board with an array of panels delineated by conductive vias marking the outer perimeter of the desired frames. The center portion 21 of each panel of the array is routed to a desired inner perimeter. Next, they frames are separated by dicing through the conductive vias exposing conductive side castellations 73.

Figure 4:
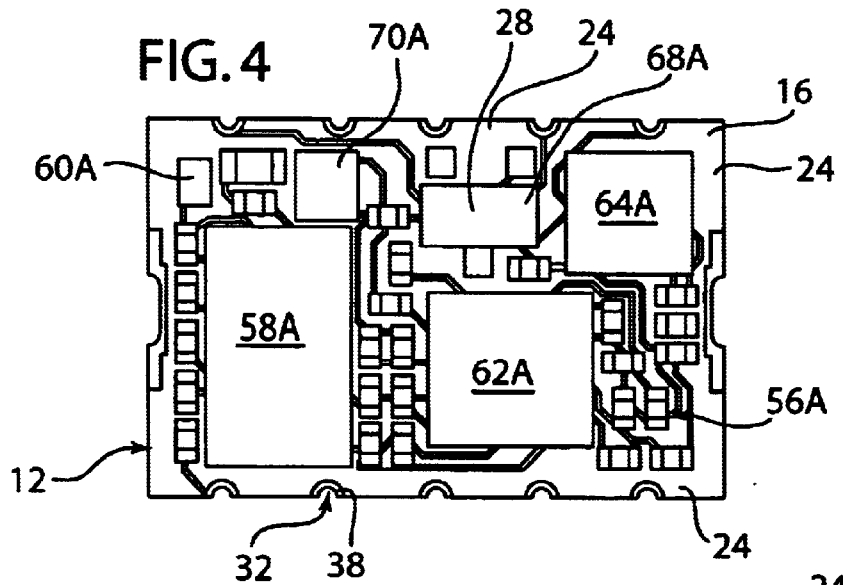
FIG. 4. is a plan view of he lower wiring panel populated with crystal oscillator circuit components;.

A plurality of populated lower panels with attached sidewall frames are prepared by providing an array of wiring board panels 16 with predetermined multi-layer circuit traces and conductive pads, including surface mount pads 34 (FIG. 5) and component surface pads 38 (FIGS. 1 and 4). Each panel is delineated by conductive vias which, upon singulation, form side castellations 36. Each lower panel is populated by surface mounting a set of oscillator components 56A. Next, side-wall frames 20 are attached by, for example, soldering to each populated lower panel 12 such that side-wall conductors 72 are aligned and connected with lower panel contacts 32. With a set of oscillator components 56A and side-wall frame 20 mounted to each lower panel 16, the plurality of lower panel subassemblies (16-56A-20) are singulated by dicing through the vias to expose castellations 36.

Likewise, a plurality of populated upper panels with attached lids are prepared by providing an array of upper wiring board panels 18 with predetermined multi-layer circuit traces and conductive pads, including mounting pads 50 (FIG. 7) and component surface pads 54 (FIGS. 1 and 6). Each panel is delineated by conductive vias which,.upon singulation, form side castellations 52 of upper panel 18. Each upper panel 18 is populated by surface mounting a set of oscillator components 56B. Metal lids 22 are next attached to upper panel 18 preferably by soldering. Lid 22 includes an access opening 76 over tunable inductor 70B to allow laser tuning after lid 22 is attached. The populated and covered upper panel subassemblies (18-56B-22) are then separated by dicing through the vias to expose.

The populated upper panel (18-56B-22) and lower-panel (16-56A-20) subassemblies are preferably separately tested and calibrated before final module assembly. Each panel 16 and 18 is equipped with accessible input/output contacts 32 and 48, respectively, for use in such testing. By comparing the oscillator output responses to a factory reference, each subassembly can be calibrated. Depending upon the features of the electronic oscillator components (56A and 56B), calibration may be either electronic by setting, for example, an IC EPROM; or physical, by setting laser-tunable inductors 70A or 70B; or some combination of electronic setup and physical adjustment.

Finally, the upper wiring panel with lid subassembly (18-56B-22) is attached to lower wiring panel with frame subassembly (16-56A-20) such that pads 50 of upper wiring panel 18 are aligned and connected to upper pads 75 of side-wall frame 20. The assembled dual range oscillator modules are available for final quality testing.

After testing, dual range oscillator module 10 may be suitably coupled to a circuit board 8 for use in an electronic device via the contacts 34 on planar bottom surface 26. The oscillator circuit 12 supported on lower panel 16 and the oscillator circuit 14 supported on upper panel 18 share input/output paths to the electronic device.

Although they no longer take the physical form of pins in surface mount applications, these input/output connections are still conventionally referred to as th e circuit "pins" or "pin-outs." In operation, the active oscillator (lower or upper) is preferably selected by setting the DC voltage level for two input/output pin outs. When lower crystal oscillator 12 is activated, upper crystal oscillator 14 is deactivated such that operating signals pass to and from lower panel components 56A through surface mount input/output contacts 34. When upper crystal oscillator 14 is activated, lower crystal oscillator 12 is deactivated such that operating signals pass to and from upper panel components 56B through surface mount input/output contacts 34 and also conductors 72 of sidewall frame 20.

An exemplary specification of input/output connections for a dual VCXO module according to the present invention is described in the following example.

EXAMPLE

A batch of dual range crystal oscillator modules 10 were fabricated according to the present invention. The example oscillator modules provide a pair of switch selectable voltage controlled crystal oscillators according to the circuit block diagram appended as FIG. 9. The example modules operate with output center frequencies of about 622.080Megahertz (MHz) on lower panel 16 and about 644.531 Megahertz (MHz) on upper panel 18.

Each wiring board panel 16 and 18 of module 10 includes a crystal oscillator subcircuit 115, a phase detector 117, a loop filter 119, a voltage controlled oscillator (VCO) circuit 121, a frequency divider circuit 123 and a sinewave-to-logic level translator circuit 64.

Crystal oscillator subcircuit 115 includes a quartz resonator 58 operably linked to gain stage elements 125 and a voltage variable capacitance element 60. A variety of crystal oscillator circuit configurations may be used including those referred to under the designations Pierce, Colpitts, Hartley, Clapp, Driscoll, Seiler, Butler and Miller. A Colpitts configuration is used for both oscillator circuits in this example.

Figure 9:
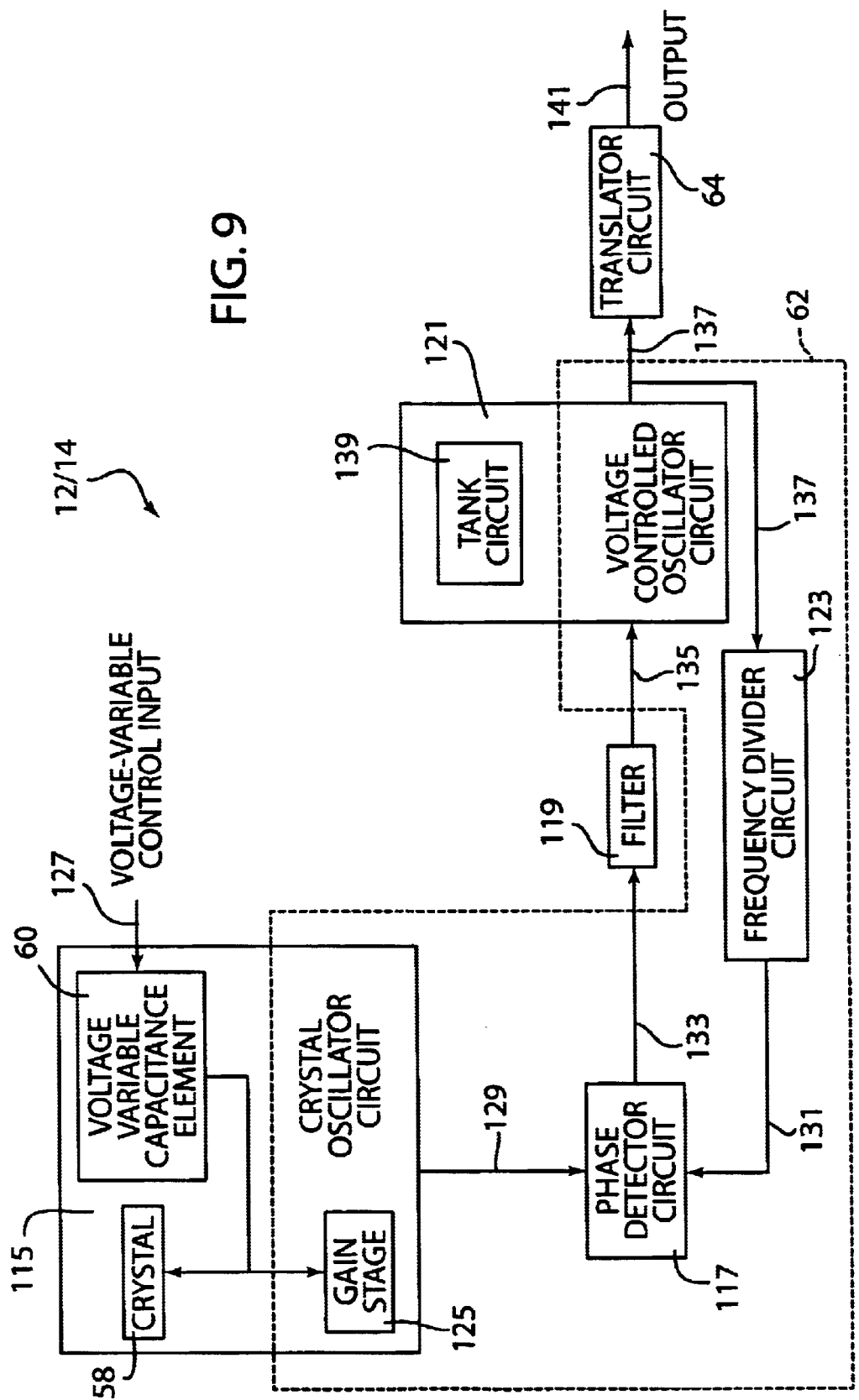
FIG. 9 is a circuit block diagram of an exemplary controllable crystal oscillator circuit according to this invention.

Voltage variable capacitance element 60 exhibits a varying capacitance in response to changes in a DC voltage variable control input 127. A voltage change made to input 127 adjusts the capacitive load of the oscillator circuit and the frequency of its output driving signal, which is represented in FIG. 9 with numeral 129.

Input 127 is preferably voltage variable. Also contemplated for the control input, but not implemented for this example, is a digital number (or equivalent) input that is converted to an analog voltage signal by a conventional digital to analog converter.

For the example module, voltage variable capacitance element 60 is a discrete variable capacitance diode (i.e., a varactor or varactor diode) although other voltage controlled variable capacitance mechanisms are contemplated. For an embodiment with increased on-chip integration, the variable capacitance element may include one or more banks of transistor switchable capacitors in a parallel circuit configuration and coupled to control logic for selectively activating capacitors in response to the control voltage. Alternatively, the variable capacitance element may include one or more banks of transistor-switchable on-chip varactor elements or combinations of capacitors and on-chip varactors coupled to control logic for selectively activating integrated varactors and capacitors in response to the control voltage. Circuits for providing on-chip variable capacitance suitable for temperature compensating crystal oscillators are described in U.S. Pat. No. 4,827,226, issued to Connell et al., and U.S. Pat. No. 5,994,970, issued to Cole et al., both of which are incorporated herein by reference to the extent it is not inconsistent.

Quartz resonator 58 is a packaged cost-effective AT-cut crystal adapted to resonate in fundamental mode at a frequency of 19.44 MHz for lower panel 16 and 20.142 MHz for upper panel 18, both against loads of about 10 picofarads.

Driving signal 129 is received by phase detector (or phase comparator) circuit 117 and compared to a reduced frequency feedback signal 131 from divider circuit 123. Phase detector 117 produces a phase offset signal 133 having a DC voltage level proportional to the phase difference between reduced frequency feedback signal 131 and driving signal 129.

Specifically, phase detector 117 includes circuit elements generating pulses proportional to the phase difference between reduced frequency feedback signal 131 and driving signal 129. The pulses are collected by a charge pump (not separately shown) that is converted to a corresponding DC voltage variable signal for controlling voltage controlled oscillator (VCO) 121.

A variety of phase detector circuit configurations are suitable for the present invention. Exemplary phase detector circuits and construction details are described in *Monolithic Phase Locked Loops & Clock Recovery Circuits: Theory and Design*, Behzad Rasavic ed., IEEE (1996). The phase detector circuit implemented for this example employs flip-flops in a configuration which has been labeled "digital phase/frequency detector" or "digital tri-state comparator." This arrangement includes two D flip-flops whose outputs are combined with a NAND gate which is then tied to the reset on each flip-flop. The outputs of the flip-flops are also connected to the charge pump inputs. Each flip-flop output signal is a series of pulses whose frequency is related to the flip-flop input frequency. When both inputs of the flip-flop are identical, the signals are both frequency and phased locked. If they are different, they will provide signals to the charge pump which will either charge or discharge the loop filter or place the charge pump in a high impedance state, thereby maintaining the charge on the loop filter.

The charge pump (not separately shown) includes two transistors, one for charging loop filter 119 and one for discharging loop filter 119. The charge pump inputs are the outputs of the flip-flops discussed above. If both amplifier inputs are low, the amplifier shifts to a high-impedance state, thereby maintaining the loop filter charge.

Both the top/upper and bottom/lower voltage controlled crystal oscillators (12 and 14) include a loop filter 119 operably linked between phase detector 117 and voltage controlled oscillator (VCO) 121 for stripping high frequency components from the VCO control signal. Voltage controlled oscillator (VCO) 121 is responsive to changes in the DC voltage level of a filtered VCO control signal 135 and provides an analog controlled frequency signal 137. Loop filter 119 serves to integrate the pulses received from phase detector 117 to create a control voltage at VCO control signal 135.

A variety of circuit configurations are suitable for providing the VCO. Exemplary highfrequency compatible VCO circuits and construction details are described in *RF Circuit Design, Theorv and Applicatiing*, Ludwig R and P. Bretchko, Prentice Hall (2000). Implemented for this example was a tuned differential amplifier with the bases and collectors cross coupled to provide positive feedback and a 360° phase shift. This tuned subcircuit is located in the collectors and is comprised of internal varactors and preferably an external capacitance/inductance-providing tank circuit 139. External tank circuit 139 also provides DC bias for the VCO.

The analog controlled frequency signal 137 is passed through frequency divider subcircuit 123. Frequency divider 123 produces a corresponding reduced frequency feedback signal 131. Frequency divider 123 allows phase detector 117 to operate on oscillating signals with frequencies in the range of the fundamental mode frequency of quartz resonator 58.

Divider circuit 123 relies on a series of flip-flops with a logic selection input for preselecting the divider ratio, though a variety of other circuit arrangements are suitable for providing frequency divider 123.

Both the top/upper and bottom/lower voltage controlled crystal oscillators (12 and 14) also include a translator subcircuit 64 to convert the analog (i.e., sinusoidal) controlled frequency signal 137 to a digital (or logic level) output signal 141. Translator subcircuit 64 is preferably a differential receiver (i.e. differential ECL driver) providing a digital output signal at voltage levels conventional for 10K or 100K positive-referenced emitter coupled logic (PECL), also called positive emitter coupled logic (PECL). Other digital logic level output standards are also contemplated including signals oscillating between voltage levels conventional for a semiconductor circuittechnology selected from the group consisting essentially of transistor transistor logic, emitter coupled logic, CMOS, MOSFET, GaAS field effect, MESFET, HEMT or PHEMT, CML and LVDS.

The outline in FIG. 9 identified by reference numeral 62 indicates which circuit elements are integrated into a single semiconductor chip module 62A on lower wiring board panel 16 and 62B on upper wiring board panel 18, respectively. Off-chip, i.e. provided by discrete components, are the quartz resonator 58 and voltage variable capacitance element 60, the loop filter 119, and VCO tank circuit 139. Although the circuit elements of sinewave to logic level translator 64 are implemented using integrated circuit semiconductor technology (i.e. a chip), translator 64 is separate from module 62.

FIG. 10 offers more detail of the oscillator circuits of the example 622.08/644.531 MHz module. FIG.10 is a diagram for the lower oscillator for the oscillator circuit 12 defined by lower wiring board panel 16 and lower set of oscillator components 56A for the example dual-range module. FIG. 10 includes the following subcircuits: crystal oscillator 58A, phase detector 117, loop filter 119, voltage controlled oscillator (VCO) 121, frequency divider 123 and sinewave-to-logic level translator 64A. In accordance with the preferred level of chip integration, phase detector circuit 117, frequency divider 123 and portions of crystal oscillator circuit 115 and VCO 121 are combined in chip module 62A. The presently preferred chip module is commercially available from RF Micro Devices (Greensboro, NC) under the designation "RF2514" and was used for this example.

Crystal oscillator circuit 115 is a Colpitts configuration including on-chip elements 143, a package crystal module 58A, and a discrete varactor 60A. Arranged in parallel with discrete varactor 60A is a fixed capacitor Cl5 for setting the overall load capacitance in the proper range. The bias DC voltage of varactor 60A is set by a control input 127. According to the Colpitts configuration, crystal oscillator circuit 115 includes a feedback loop 145 with capacitor Cl3.

Crystal resonator 58A is surface mountable and of the type commercially available from CTS Wireless Components (Bloomingdale, Ill.) under the designation ATXN6034A and adapted to resonate at 19.44MHz under a 10 picofarad load.

Crystal oscillator circuit 115 provides a reference output 129 to the on-chip phase detector circuit 117. Chip module 62A includes a connection 147 (LOOP$_{13}$ FLT) for loop filter 119. Loop filter 119 receives and integrates a frequency offset signal 133 from phase detector circuit 117. Loop filter 119 includes capacitors C11 and C3 and a resistor R4.

Loop filter 119 provides a VCO control signal 135 to voltage controlled oscillator circuit 121, which includes on-chip and discrete components. Preferably off-chip are discrete components forming a tank circuit 139: two inductors L2 and L3 and a capacitor C2, which are connected through 149 (RESNTR+) and 151 (RESNTR−) on module 10. Variable inductor 70A allows the VCO output center frequency to be tuned (or "trimmed") to offset unavoidable variations in the various VCO components. Variable inductor 70A preferably takes the form of a laser trimmable area of metallization, also called a "laser paddle." VCO circuit 121 of module 10 receives a bias voltage through tank circuit 139 via a connection 153 with resistor R1.

VCO circuit 121 includes an on-chip output amplifier 153 for providing an isolated controlled frequency signal 137B (TX_OUT) in response to controlled frequency signal.

Frequency divider 123 receives controlle frequency signal 137A and provides a reduced frequency feedback signal 131. The divider ratio of frequency divider 123 is preselected by setting a logic input 155 ($DIV_{13}$ CTRL). As shown, input 155 is connected to ground to create a logic low for setting module 62A to a divider ratio of 32 to 1 for this example.

Circuit 12 includes a sinewave-to-logic level translator 64A in the form of a differential receiver, which receives sinewave output signal 137B. The differential receiver employed for this example is commercially available from Arizona Microtek (Mesa, Ariz.) under the designation "AZ100EL16VEL." Differential receiver module 64A provides a digital output signal according to the 10 K Positive Emitter Coupled Logic (PECL) standard: logical zero is in the range from about (Vcc−1.63) volts to (Vcc−1.95) volts, logical one is in the range from about (Vcc−0.75) volts to (Vcc−0.98) volts. These output levels are realized when the supply voltage to module 10 is about 3.3 volts. The PECL output is complementary requiring two terminals (Q_OUT-PIN-6) and (/$Q_{13}$ OUT-PIN-7).

Frequency controllable oscillator circuit 12 demonstrates a preferred level of circuit integration. There is special advantage to a circuit integration scheme in which voltage controlled oscillator (VCO) 121 includes a non integrated tank circuit 139. Also preferably off chip are the circuit elements making up the loop filter 119 and varactor 60A.

Module 62A includes the following connections not yet otherwise identified: GND1, GND2, GND3, PD, VCC1, VCC2, MOD IN, VREF, LD_FLT. GND1 and GND3 are ground connections for use by the analog components of module 62. GND 2 is a ground connection for use with the digital elements of the phase detector and locking circuits. PD is a DC voltage on-off switch. VCC1 is a DC bias for isolation amplifier 151. VCC2 a DC bias input connection for VCO 121. MOD IN is not used for oscillator circuit 12 (or 14). VREF is not used for the example except for providing a high Q filter. LD_FLT is a discrete filter connection for the phase detector circuit.

Circuit and package design for components having signals at radio frequency (RF) include a number of bypass capacitors to suppress parasitic signals which may be picked up on nearby device circuits such as transistors and transmission lines. Oscillator circuit 12 includes the following such filtering capacitors C1, C4, C5, C6, C8 and C9.

Specifications for selected lower panel circuit elements shown in FIG. 10 are presented in TABLE I, below.

TABLE I

Lower/Bottom Panel Oscillator

| Reference ID (from FIG. 10) | Specification |
| --- | --- |
| C1, C4, C5, C6, C8, C9 | 0.1 μF |
| C2 | 1.8 pF |
| C3 | 0.22 μF |
| C7 | 3 pF |
| C11 | 220 pF |
| C12 | 1000 pF |
| C13 | 43 pF |
| C14 | 39 pF |
| C15 | 3.6 pF |
| C15 | 2.7 pF |
| R1 | 1.5 KΩ |
| R2, R6 | 10 Ω |
| R3, R9 | 10 KΩ |
| R4 | 4.3 KΩ |
| R5 | 51 Ω |
| R7 | 100 KΩ |
| R8 | 47 KΩ |
| L1 | 39 nH |
| L2 | 22 nH |
| L3 | 15 nH |
| 58A | 19.44 MHz |
| DC Supply VCC Range | 3.15–3.45 V |
| Control Input VC Range | 0.15 to 3.15 V |
| Target Load Impedance | 50 Ω |
| Pullability | −100 to +100 ppm |

The lower panel oscillation circuit 12 also includes an activation switch 68A (Q1) between the DC power input VCC-PIN8 157 and the other circuit components. Switch 68A is a surface mountable MOS transistor. Switch 68A allows the lower panel oscillator circuit to be selectively activated.

It is an important feature of this invention that the lower and upper oscillator circuits can be independent but nearly the same circuit. For the example 622.08/644.531 MHz dual VCXO module, the lower and upper oscillator circuits are substantially the same. The FIG. 10 circuit diagram also represents the upper panel oscillator circuit 14, except that the activation switch 68B of upper panel 18 is controlled by B1-PIN10 as shown in FIG. 11. Table II, below, includes the component specification for upper panel oscillator circuit 14.

TABLE I

Upper/Top Panel Oscillator

| Reference ID (from FIGS. 10/11) | Specification |
| --- | --- |
| C1, C4, C5, C6, C8, C9 | 0.1 μF |
| C2 | 2.2 pF |
| C3 | 0.22 μF |
| C7 | 3 pF |
| C11 | 220 pF |
| C12 | 1000 pF |
| C13 | 43 pF |
| C14 | 39 pF |
| C15 | 3.6 pF |
| R1 | 1.5 KΩ |
| R2, R6 | 10 Ω |
| R3, R9 | 10 KΩ |
| R4 | 4.3 KΩ |
| R5 | 51 Ω |
| R7 | 100 KΩ |
| R8 | 47 KΩ |
| L1 | 39 nH |
| L2 | 22 nH |
| L3 | 12 nH |
| 58A | 20.142 MHz |
| DC Supply VCC Range | 3.15–3.45 V |
| Control Input VC Range | 0.15 to 3.15 V |
| Target Load Impedance | 50 Ω |
| Pullability | −100 to +100 ppm |

Figure 3:
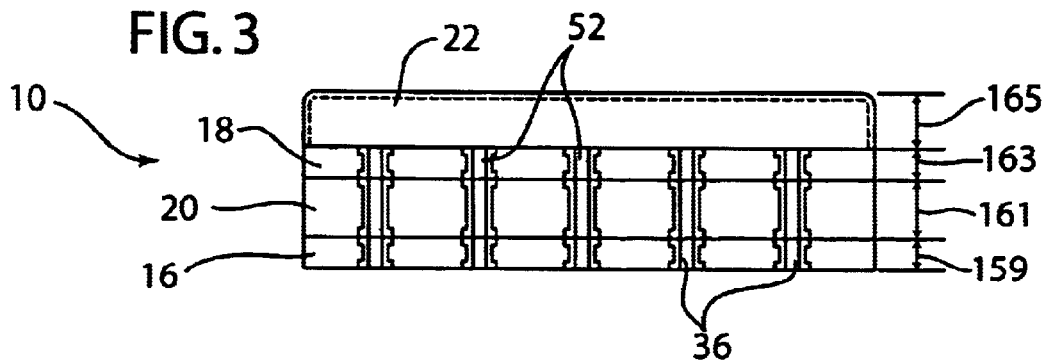
FIG. 3 is a side view of the dual-range oscillator module of FIG. 1 shown assembled.
Figure 5:
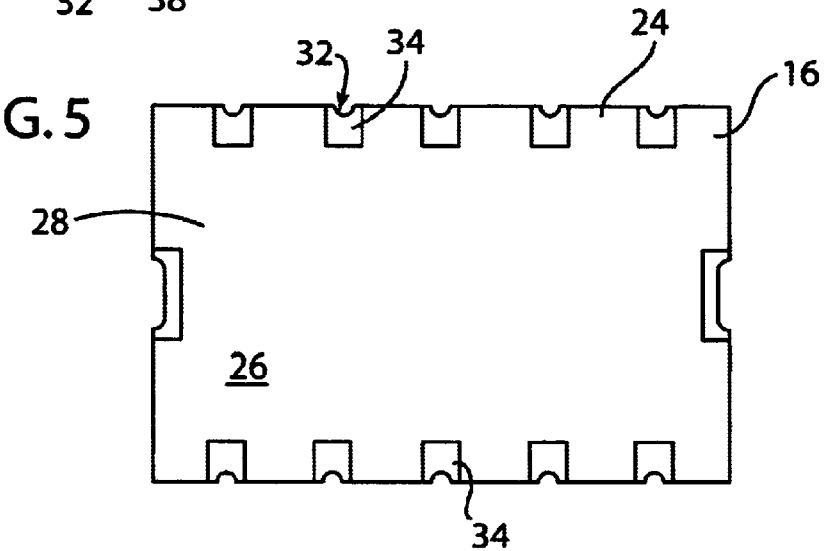
FIG. 5 is a plan view of the surface mount(i.e.bottom) side of the lower wiring board panel.

The example dual-range oscillator module is provided in a surface-mountable package having ten input/output connections as shown in FIGS. 5, 9 and 10. The example module has a footprint dimension of 9.3 millimeters (mm) by 14 mm. The example module has a total board height of about 4.26 millimeters (mm), which is the sum of 0.56 mm for the thickness 159 (FIG. 3) of lower panel 16, 1.57 mm for the thickness 161 of side wall frame 20, 0.56 mm for the thickness 163 of upper panel 18 and 1.57 mm for the height 165 of lid 22. As best shown in FIG. 3, cover 22, upper panel 18, lower panel 16 and frame 20 have substantially the same major horizontal dimensions of 9.3 mm by 14 mm.

Alternate Module Configurations

The example dual range oscillator module above provides two user-selectable high performance VCXOs operating around center frequencies of 622.08 MHz and 644.531 MHz, respectively. Alternate combinations are contemplated, however. For example, the present invention is also especially well suited for providing in a single module a relatively fixed output frequency crystal clock together with a voltage controllable crystal oscillator.

A selection of preferred oscillator combinations is presented in Table III, below.

TABLE III

Dual Range Module Configurations

| type | 1st Center Freq. (MHz) | 2nd Center Freq. (MHz) |
|---|---|---|
| Example 1 (above) VCXO/VCXO | 622.08 | 644.531 |
| Example 2 VCXO/VCXO | 622.08 | 666.514 |
| Example 3 VCXO/VCXO | 622.08 | 669.326 |
| Example 4 VCXO/Clock | 622.08 | 644.531 |
| Example 5 VCXO/Clock | 644.531 | 622.08 |

It is a feature of the present invention that the upper wiring board panel with upper crystal oscillator components itself has a form substantially similar to a stand alone, surface mountable and single-output voltage controlled crystal oscillator (VCXO) component. Likewise, the lower wiring board panel with lower crystal oscillator components has a form substantially similar to a stand alone, surface-mountable VCXO component. Therefore, the manufacturing of the individual upper and lower portions of the dual range VCXO module is compatible with processes for fabricating surface-mountable single output modules.

Numerous variations and modifications of the embodiments described above may be effected without departing from the spirit and scope of the novel features of the invention. No limitations with respect to the specific system illustrated herein are intended or should be inferred. It is, of course, intended to cover by the appended claims all such modifications as fall within the scope of the claims.

I claim:

1. A dual-range oscillator module comprising:
   a lower and an upper wiring board panel, each panel having a component side, a surface mount side, a central portion and an outer edge portion including a plurality of input-output contacts;
   a lower set of oscillator components mounted to the component side of the lower wiring board panel, the lower set of oscillator components and the lower wiring board panel together defining a first oscillator circuit;
   an upper set of oscillator components mounted to the component side of the upper wiring board panel, the upper set of oscillator components and the upper wiring board panel together defining a second oscillator circuit;
   a side-wall frame between the upper and the lower wiring boards, the side-wall frame including a plurality of conductors providing connections between the input-output contacts of the upper wiring board panel and the input-output contacts of the lower wiring panel.

2. The module of claim 1 wherein the plurality of input-output contacts of the lower panel includes a plurality of contacts on the component side aligned and interconnected with a plurality of mounting pads on the surface mount side.

3. The module of claim 2 wherein the plurality of conductors extends between the plurality of contacts of the upper panel and the plurality of contacts on the component side of the lower panel.

4. The module of claim 1 wherein the side-wall frame is made of a printed wiring board material.

5. The module of claim 1 wherein the side-wall frame is made of an material satisfying the FR-4 specification.

6. The module of claim 1 wherein the plurality of conductors is a plurality of metallized castellations defined in an outside surface of the side-wall frame.

7. The module of claim 1 wherein the plurality of conductors is a plurality of conductive vias extending through the side-wall frame.

8. The module of claim 1 wherein each set of oscillator components includes a crystal resonator.

9. The module of claim 1 wherein each set of oscillator components includes a packaged crystal resonator.

10. The module of claim 1 wherein at least one of the first and the second oscillator circuits is a voltage controlled crystal oscillator circuit.

11. The module of claim 1 wherein a power switch is mounted to the lower panel and operably linked to the first circuit for selectively enabling the first circuit.

12. The module of claim 1 wherein each panel contains multilayer circuit traces.

13. The module of claim 1 wherein each panel has substantially the same circuit layout.

14. The module of claim 1 wherein the first panel, the second panel and the frame have substantially the same outline.

15. The module of claim 1 further comprising a cover mounted to upper panel, the upper panel and the cover together enclosing the upper set of components.

16. The module of claim 1 having a footprint of about 9 millimeters by about 14 millimeters.

17. A dual-range oscillator module comprising:
   a lower and an upper wiring board panel, each panel having a component side, a surface mount side, a central portion and an outer edge portion including a plurality of input-output contacts;
   a lower set of crystal oscillator components mounted to the component side of the lower wiring board panel, the lower set of crystal oscillator components and the lower wiring board panel together defining a first crystal oscillator circuit;
   an upper set of crystal oscillator components mounted to the component side of the upper wiring board panel, the upper set of crystal oscillator components and the upper wiring board panel together defining a second crystal oscillator circuit;
   a side-wall frame between the upper and the lower wiring boards, the side-wall frame including a plurality of conductors providing connections between the input-output contacts of the upper wiring board panel and the input-output contacts of the lower wiring panel.

18. The module of claim 17 wherein each crystal oscillator circuit includes an off-chip tank circuit.

19. The module of claim 17 wherein each crystal oscillator circuit includes a laser-tunable inductor.

20. The module of claim 17 wherein at least one of the first and second oscillator circuits has a fixed frequency output.

21. The module of claim 17 wherein at least one of the first and the second oscillator circuits is a voltage controlled crystal oscillator circuit.

22. The module of claim 17 wherein at least one of the first and second oscillator circuits has a fixed frequency output.

23. The module of claim 17 wherein at least one of the first and the second oscillator circuits is a voltage controlled crystal oscillator circuit having a voltage controlled oscillator subcircuit, a phase-locked loop subcircuit and a tank subcircuit.

24. The module of claim 17 wherein each panel has substantially the same circuit layout.

* * * * *